United States Patent
Sinclair et al.

(10) Patent No.: US 10,192,727 B2
(45) Date of Patent: Jan. 29, 2019

(54) ELECTRODYNAMIC MASS ANALYSIS

(71) Applicant: Varian Semiconductor Equipment Associates, Inc., Gloucester, MA (US)

(72) Inventors: Frank Sinclair, Boston, MA (US);
Joseph C. Olson, Beverly, MA (US);
Costel Biloiu, Rockport, MA (US);
Alexandre Likhanskii, Malden, MA (US); Peter F. Kurunczi, Cambridge, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 15/471,507

(22) Filed: Mar. 28, 2017

(65) Prior Publication Data

US 2018/0286653 A1    Oct. 4, 2018

(51) Int. Cl.
| | |
|---|---|
| *H01J 37/05* | (2006.01) |
| *H01J 49/22* | (2006.01) |
| *H01J 49/06* | (2006.01) |
| *H01J 37/317* | (2006.01) |
| *H01J 49/10* | (2006.01) |

(52) U.S. Cl.
CPC ............ *H01J 49/061* (2013.01); *H01J 37/05* (2013.01); *H01J 37/3171* (2013.01); *H01J 49/22* (2013.01); *H01J 49/10* (2013.01)

(58) Field of Classification Search
CPC ........ H01J 49/061; H01J 49/062; H01J 49/22; H01J 37/3171; H01J 37/05; H01J 49/10
See application file for complete search history.

(56) References Cited

U.S. PATENT DOCUMENTS

| | | | | |
|---|---|---|---|---|
| 2004/0084616 A1* | 5/2004 | Hirano | ................... | H01J 49/145 250/288 |
| 2004/0119012 A1* | 6/2004 | Vestal | ................... | H01J 49/025 250/287 |
| 2010/0057372 A1* | 3/2010 | Fagerquist | ......... | G01N 33/6851 702/20 |
| 2013/0260543 A1* | 10/2013 | Koo | ........................ | C23C 14/48 438/515 |
| 2017/0032952 A1* | 2/2017 | Verenchikov | ......... | H01J 49/403 |

OTHER PUBLICATIONS

Alexandre Likhanskii, Ion Mass Separation Using RF Extraction, filed as U.S. Appl. No. 15/417,767, filed Jan. 27, 2017.

* cited by examiner

*Primary Examiner* — Eliza Osenbaugh-Stewart
(74) *Attorney, Agent, or Firm* — Nields, Lemack & Frame, LLC

(57) ABSTRACT

An electrodynamic mass analysis system which has the capability of filtering unwanted species from an extracted ion beam without the use of a mass analyzer magnet is disclosed. The electrodynamic mass analysis system includes an ion source and an electrode disposed outside the ion source. The ion source and the electrode are biased relative to one another so as to emit pulses of ions. Each of these pulses enters a tube where each ion travels at a speed related to its mass. Thus, ions of the same mass travel in clusters through the tube. Ions reach the distal end of the tube separated temporally and spatially from one another based on their mass. The ions then enter a deflector, which is energized so as to allow the cluster of ions having the desired mass to pass through a resolving aperture disposed at the exit of the deflector.

19 Claims, 4 Drawing Sheets

ELECTRODYNAMIC MASS ANALYSIS

FIELD

Embodiments relate to an apparatus for performing mass separation, and more particularly, an electrodynamic mass analysis system which uses changing electrical fields to separate ions according to mass.

BACKGROUND

Ions are used in a plurality of semiconductor processes, such as implantation, amorphization, deposition and etching processes. These ions may be created within an ion source chamber and extracted through an extraction aperture in the ion source chamber.

There are several different types of ion implantation systems. One type is referred to as a beam-line system. In a beam-line system, ions are extracted from an ion source, pass through a mass analyzer to select particular ions based on their mass, energy and charge, and are made into a parallel ribbon ion beam. Beam-line systems may also include deceleration stages, and other components to make the resulting ribbon ion beam more uniform.

The mass analyzer described above is typically a large curved magnet. This magnet bends a beam of ions that all have the same energy in a curve, whose radius is dependent on the ion mass. Ions have a desired mass exit through a resolving aperture, while ions having different masses travel along a curve that does not permit them to exit through the resolving aperture. These magnets are large, expensive and heavy and represent a significant fraction of the total cost of the beam-line system. These magnets also have special safety concerns because the stray magnetic fields can interfere with the operation of pacemakers. Further, these magnets also are a source of environmental concerns, since these magnets consume a large fraction of the electrical power needed to operate the beam-line system.

It would be beneficial if there were apparatus that retains the function of the mass analyzer, but is capable of performing this function at lower cost, space and power. Further, it would be advantageous if this apparatus were easily tunable to select one of a plurality of ions, depending on the process being performed.

SUMMARY

An electrodynamic mass analysis system which has the capability of filtering unwanted species from an extracted ion beam without the use of a mass analyzer magnet is disclosed. The electrodynamic mass analysis system includes an ion source and an electrode disposed outside the ion source. The ion source and the electrode are biased relative to one another so as to emit pulses of ions. This may achieved by using a time dependent voltage within the extraction electrode assembly, the ion source itself or both. Each of these pulses enters a tube where each ion travels at a speed related to its mass. Thus, ions of the same mass travel in clusters through the tube. Ions reach the distal end of the tube separated temporally and spatially from one another based on their mass. In another embodiment, the ion source and extraction system produce a constant beam of ions and a time dependent voltage electrode at the start of the tube forms them into bunches. The ions then enter a deflector, which is energized with a time dependent voltage so as to allow the cluster of ions having the desired mass to pass through a resolving aperture disposed at the exit of the deflector.

According to one embodiment, an electrodynamic mass analysis system is disclosed. The electrodynamic mass analysis system comprises an ion source; an electrode assembly to extract a pulse of ions from the ion source; and a deflector to receive the pulse of ions after the ions travel a predetermined distance from the electrode assembly, wherein the deflector deflects the ions in accordance with an arrival time, such that only ions arriving during a predetermined time interval are guided through the deflector and exit the deflector. In certain embodiments, the electrodynamic mass analysis system also comprises a buncher tube disposed in a space between the electrode assembly and the deflector, having an input end and an output end, wherein the pulse of ions enters the input end of the buncher tube from the electrode assembly, wherein the buncher tube manipulates the ions to cause the pulse of ions entering the input end to be grouped in a cluster, the buncher tube having a length sufficient to allow separation of the ions in accordance with relative mass, and wherein the deflector receives the ions exiting the output end of the buncher tube. In some further embodiments, a first time varying voltage is applied to the buncher tube and a second time varying voltage is applied to the deflector. In certain further embodiments, a frequency of the first time varying voltage is equal to a frequency of the second time varying voltage. In certain embodiments, chamber walls of the ion source are biased at a constant voltage and a time varying voltage is applied to the electrode assembly to extract the pulse of ions. In certain embodiments, chamber walls of the ion source are biased at a time varying voltage and a constant voltage is applied to the electrode assembly to extract the pulse of ions. In certain embodiments, only electric fields are used to manipulate the ions.

According to another embodiment, an electrodynamic mass analysis system is disclosed. The electrodynamic mass analysis system comprises an ion source having a plurality of chamber walls defining an ion source chamber, wherein one of the chamber walls comprises an extraction aperture; a suppression electrode to extract a pulse of ions from the ion source chamber though the extraction aperture; and a deflector to receive the ions extracted from the ion source, the deflector comprising two curved electrodes disposed on opposite sides of a path of the ions, wherein a time varying voltage is applied to at least one of the two curved electrodes, and wherein a voltage applied to the two curved electrodes is different. In certain embodiments, a first time varying voltage is applied to a first curved electrode and a second time varying voltage is applied to a second curved electrode, and wherein a frequency of the first time varying voltage is equal to a frequency of the second time varying voltage, and a phase of the first time varying voltage is different than a phase of the second time varying voltage. In certain embodiments, only electric fields are used to manipulate the ions. In certain embodiments, a buncher tube is disposed between the suppression electrode and the deflector, having an input end and an output end, wherein the pulse of ions from the ion source enters the input end of the buncher tube, wherein the buncher tube comprises one or more conductive electrodes, and the ions exit the output end and enter the deflector. In certain further embodiments, a first time varying voltage is applied to a first curved electrode and a second time varying voltage is applied to the buncher tube, and wherein a frequency of the second time varying voltage is equal to a frequency of the first time varying voltage. In certain embodiments, a first time varying voltage is applied to the suppression electrode, a second time varying voltage is applied to the buncher tube, and a third time varying voltage is applied to the deflector, wherein a frequency of the first time varying voltage, a frequency of the second time varying voltage and a frequency of the third time varying voltage are equal. In certain embodiments, a time varying voltage is applied to a first curved electrode and a constant voltage is applied to a second curved electrode.

According to another embodiment, an electrodynamic mass analysis system is disclosed. The electrodynamic mass analysis system comprises an ion source having a plurality of chamber walls defining an ion source chamber, wherein one of the chamber walls comprises an extraction aperture; a suppression electrode to extract a pulse of ions from the ion source chamber though the extraction aperture; a buncher tube, having an input end and an output end, wherein the pulse of ions enters the input end of the buncher tube, wherein the buncher tube comprises one or more conductive electrodes; a deflector to receive the ions exiting the output end of the buncher tube, the deflector comprising two curved electrodes disposed on opposite sides of a path of the ions; a first power supply, in communication with the suppression electrode, the first power supply generating a first voltage having a first DC component and a first AC component, the first AC component comprising a frequency and a first phase; a second power supply, in communication with the buncher tube, the second power supply generating a second voltage having a second DC component and a second AC component, the second AC component comprising the frequency and a second phase; and a third power supply, in communication with a first of the two curved electrodes, the third power supply generating a third voltage having a third DC component and a third AC component, the third AC component comprising the frequency and a third phase. In certain embodiments, a fourth voltage is applied to a second of the two curved electrodes, the fourth voltage having the third DC component and a fourth AC component, the fourth AC component comprising the frequency and a fourth phase. In some embodiments, the fourth phase is 180° different from the third phase. In certain embodiments, the buncher tube comprises a plurality of electrodes, wherein the second voltage is applied to the plurality of electrodes. In certain embodiments, a resolving aperture is disposed at an output end of the deflector. In certain embodiments, the electrodynamic mass analysis system has a mass resolution of at least 2.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
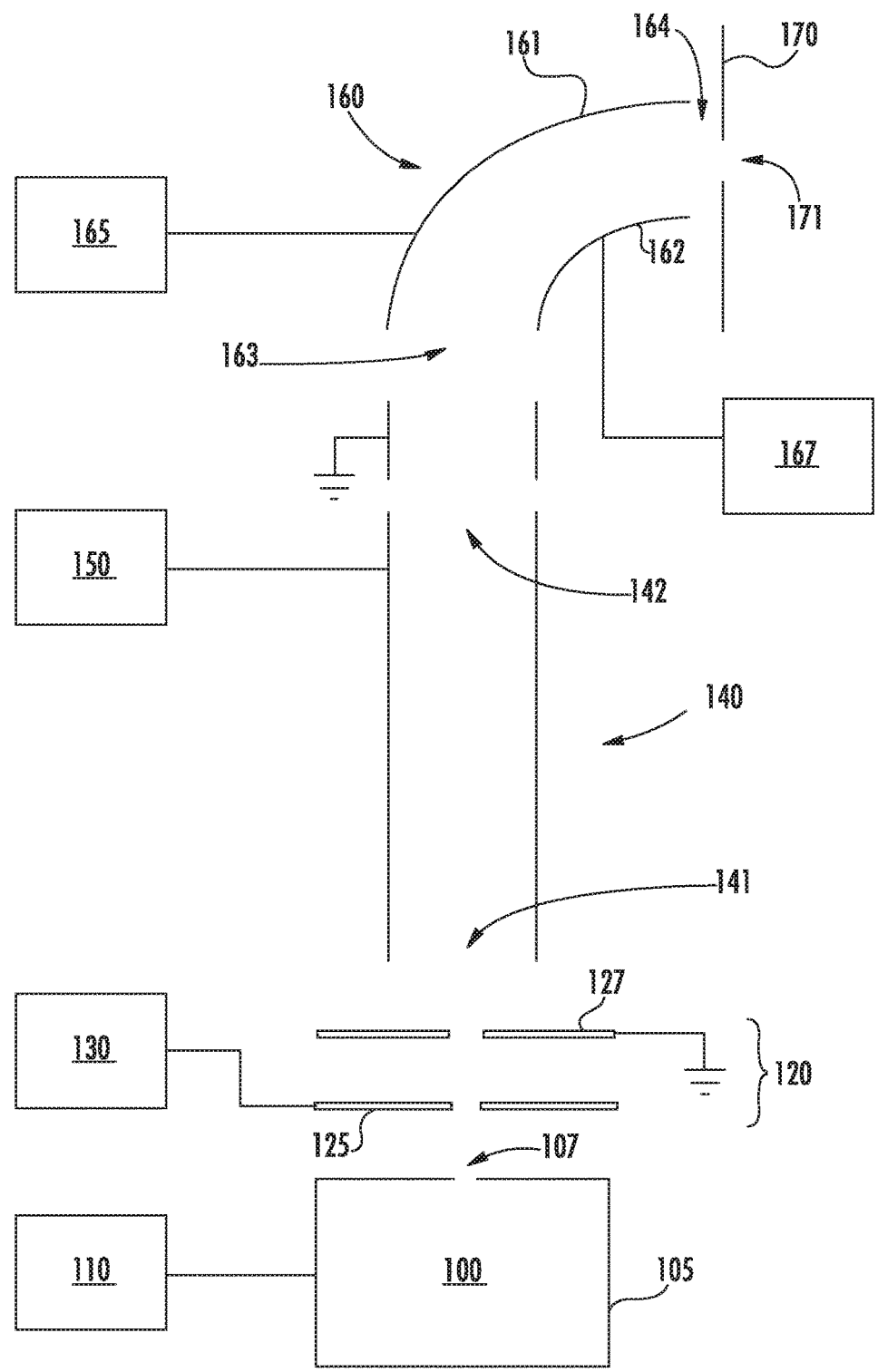
FIG. 1 shows an electrodynamic mass analysis system for separating ions based on their mass according to one embodiment.

FIG. 1 shows a first embodiment of an electrodynamic mass analysis system that may be used to separate ions according to mass using changing electrical fields.

The electrodynamic mass analysis system includes an ion source 100, which is used to create ions. The ion source may be any suitable type.

For example, in one embodiment, the ion source 100 includes a chamber having at least one chamber wall made of a dielectric material. An antenna, which is energized using an RF voltage, may be disposed outside the ion source proximate the dielectric material. A feedgas may be introduced into the chamber. The antenna emits energy which causes the feedgas to create a plasma within the chamber of the ion source 100.

In another embodiment, the ion source may include an indirectly heated cathode disposed within the chamber of the ion source. A filament is disposed behind the cathode and is energized so as to emit electrons. These electrons strike the back surface of the indirectly heated cathode, and cause the cathode to release electrons into the chamber of the ion source 100. These electrons collide with molecules of a feedgas that is present in the chamber to create ions.

These are only two illustrative examples of the ion source. Of course, other embodiments, such as a Bernas ion source, a capacitively coupled plasma source, and others, may also be employed.

As shown in FIG. 1, the ion source 100 may have a plurality of chamber walls 105, where at least one of these walls is conductive and is electrical communication with bias power supply 110. The voltage applied by the bias power supply 110 sets the energy of the ions that will be extracted through the extraction aperture 107 of the ion source 100.

In certain embodiments, the bias power supply 110 may supply a constant voltage, also known as a DC voltage, to the chamber walls 105 of the ion source 100. However, in other embodiments, the bias power supply 110 may supply a time varying voltage, also known as an AC voltage, to the chamber walls 105. In certain embodiments, the bias power supply 110 may supply a voltage which is comprised of an AC voltage and a DC voltage.

Disposed outside the ion source 100 and proximate the extraction aperture 107 is an electrode assembly 120. In this particular embodiment, the electrode assembly 120 comprises a suppression electrode 125 and a ground electrode 127. However, in other embodiments, more or fewer electrodes may be used to form the electrode assembly 120. Each electrode may include an aperture, such that the ions extracted from the ion source 100 pass though the aperture in each respective electrode.

One of the electrodes in the electrode assembly 120, typically the electrode closest to the extraction aperture 107, is biased relative to the ion source 100 so as to cause ions to be extracted through the extraction aperture 107. Others of the electrodes may also be biased to manipulate the ions as they exit the ion source 100. In the embodiment of FIG. 1, the suppression electrode 125 is disposed closer to the extraction aperture 107, and is in electrical communication with electrode power supply 130. The electrode power supply 130 may supply a DC voltage to the suppression electrode 125, an AC voltage, or a voltage having both AC and DC components. The ground electrode 127 may be directly connected to ground.

In one embodiment, the chamber wall 105 may be biased at a DC voltage by the bias power supply 110, while the suppression electrode 125 is biased by the electrode power supply 130. The electrode power supply 130 may output a voltage which having both DC and AC components. This voltage may be in the form $V=V_{ac1}*\sin(ft)+V_{dc1}$, where $V_{ac1}$ is the amplitude of the AC component, $V_{dc1}$ is the amplitude of the DC component, and f is the frequency of the time-varying component. In certain embodiments, the bias power supply 110 supplies a positive DC voltage to the chamber walls 105. In order to extract ions from the ion source 100, the suppression electrode 125 has a voltage more negative than the voltage applied to the chamber walls 105. If the ion source 100 is biased at $V_{source}$, then ions can be extracted when:

$$V_{source} > V_{ac1}*\sin(ft) + V_{dc1}, \text{ or}$$

$$(V_{source} - V_{dc1})/V_{ac1} > \sin(ft)$$

In other words, the ions are extracted only when the sine function is less than a particular value, which is determined based on the amplitudes of $V_{source}$, $V_{ac1}$ and $V_{dc1}$. Thus, by proper selection of these three values, along with the frequency of the AC component, the duration of the pulse during which ions can be extracted, can be established. Further, the value of $V_{source}$ determines the energy of the ions that are extracted from the ion source 100. Further, the voltage difference between ground and the ion source 100 may be referred to as the extraction voltage.

While the above illustrates the embodiment where the ion source 100 is held at a constant voltage and a time-varying voltage is applied to the suppression electrode 125, it is understood that this relationship could be reversed. In other words, a constant voltage may be applied to the suppression electrode 125, while a time-varying voltage is applied to the chamber walls 105 of the ion source 100.

As stated above, when the voltage applied to the suppression electrode 125 is more negative (or less positive) than the voltage applied to the ion source 100, ions are extracted through the extraction aperture 107. These ions pass through an aperture in the suppression electrode 125 and the ground electrode 127. In embodiments where the electrode assembly 120 comprises a different configuration, the ions pass through the apertures disposed in each of the electrodes that make up the electrode assembly 120.

Thus, the voltage applied to the electrode assembly 120 and the voltage applied to the chamber walls 105 are configured so as to emit a pulse of ions, where the pulse has a predetermined duration. In certain embodiments, the pulse may be less than about 1 milliseconds. In other embodiments, the pulse may be less than 30 nanoseconds. Of course, the pulse may be other durations, and these are simply illustrative of possible implementations.

After passing the electrode assembly 120, the ions enter a buncher tube 140. The buncher tube 140 has an input end 141 and an output end 142. In certain embodiments, the buncher tube 140 may be an electrically conductive closed tube, having a circular, rectangular, oval or elliptical cross-section. In other embodiments, the buncher tube 140 may be defined by a plurality of spaced apart electrodes which define the outer boundary of the tube shape.

The buncher tube 140 is used to retard the ions that exit the electrode assembly 120 first, and to accelerate the ions that exit the electrode assembly 120 last. In other words, ions are being extracted from the ion source 100 during the duration of time where the voltage between the suppression electrode 125 and the ion source 100 is negative. This duration may be arbitrary in length. For example, if the frequency of the time-varying component is 400 kHz, the duration of the pulse will be no more than 1.25 μseconds.

The buncher tube 140 is in communication with a tube power supply 150. In embodiments where the buncher tube 140 is composed of a plurality of spaced apart electrodes, all of the electrodes may be in communication with tube power supply 150. The tube power supply 150 applies a time-varying voltage to the buncher tube 140. The frequency of the time-varying voltage may be equal to the frequency of the electrode voltage. However, to retard the leading ions and accelerate the lagging ions, the phase of the time-varying component of the voltage applied to the buncher tube 140 is different than the phase of the time-varying component of the voltage applied to the suppression electrode 125. In other words, if the voltage applied to the suppression electrode is defined as:

$$V_{electrode} = V_{ac1}*\sin(ft) + V_{dc1},$$

then the voltage applied to the buncher tube 140 may be defined as $V_{ac2}*\sin(ft+\varphi_2) + V_{dc2}$, where $V_{ac2}$ is the amplitude of the AC component applied to the buncher tube 140, $V_{dc2}$ is the amplitude of the DC component, f is the frequency of the time-varying component, and $\varphi_2$ is the phase of the time-varying component. Typically, $\varphi_2$ is a non-zero value.

The buncher tube 140 is of such a length that the ions of different masses are sufficiently separated in both time and space. Specifically, assume that all ions enter the buncher tube 140 at the input end 141 with an energy of E. This energy is determined based on the extraction voltage and the charge of the ion. If it is assumed that most of the ions will be singly charged, it can be stated that the energy of the ions is a function of the extraction voltage. Knowing that the kinetic energy (E) of each ion is given by ½*mass (m)*velocity², it is easily shown that each species of ions travels at a unique velocity, which is defined as: $v = \sqrt{2E/m}$, where m is defined by the chemical composition of the ion. For example, if $BF_3$ is used as the feedgas, ions of B, F and $BF_2$ may be created. The masses of each are 11, 19 and 49 amu, respectively. Thus, the ions of boron (B) will travel more than twice as fast as the $BF_2$ ions and 30% faster than F ions. By properly sizing the buncher tube 140, this difference in velocity can be converted to a spatial and temporal difference. Stated differently, the difference in mass is shown by differences in time of flight. For instance, a 5 keV boron ion has a velocity of approximately 300,000 meters per second. Such an ion, entering a 0.5 meter long buncher tube at the same time as a 5 keV fluorine ion, would emerge approximately 0.5 microseconds before the fluorine ion.

A deflector 160 is disposed proximate the output end 142 of the buncher tube 140, such that ions that exit the buncher tube 140 enter the input end 163 of the deflector 160. In certain embodiments, the deflector 160 comprises an outer curved electrode 161 and an inner curved electrode 162. The path of the ions through the deflector 160 may be arcuate. The path may have a radius of curvature of less than 1 meter in certain embodiments. In certain embodiments, the radius of curvature may be less than 0.5 meters. In other embodiments, the deflector 160 may be constructed differently. However, in most embodiments, the deflector 160 comprises at least two electrodes disposed on opposite sides of the desired path of the ions. In this way, ions entering the deflector 160 are affected by two different electrical forces. Thus, while the term "curved" is used to describe the shape of the electrodes that make up the deflector 160, it is understood that on other embodiments, differently shaped electrodes may be used.

As with all electrodes described herein, these electrodes are electrically conductive. In certain embodiments, the outer curved electrode 161 and the inner curved electrode 162 are each in communication with a respective deflector power supply. For example, the outer curved electrode 161 may be in electrical communication with an outer deflector power supply 165. The inner curved electrode 162 may be in electrical communication with an inner deflector power supply 167.

A time-varying voltage is applied to at least one of the curved electrodes. For example, in one embodiment, the outer deflector power supply 165 may apply a voltage to the outer curved electrode 161 which is defined as:

$$V_{outer} = V_{ac3} * \sin(ft + \varphi_3) \, V_{dc3},$$

where $V_{ac3}$ is the amplitude of the AC component applied to the outer curved electrode 161, $V_{dc3}$ is the amplitude of the DC component, f is the frequency of the time-varying component, and $\varphi_3$ is the phase of the time-varying component. Typically, $\varphi_3$ is a non-zero value and may be different than $\varphi_2$.

The inner deflector power supply may apply a constant voltage to the inner curved electrode 162. This voltage may be defined as:

$$V_{inner} = V_{dc3},$$

where the DC component of the inner curved electrode 162 is the same as the DC component of the outer curved electrode 161.

In this embodiment, the ions that enter the input end 163 of the deflector 160 are deflected in accordance with the voltage applied to the outer curved electrode 161. When the AC component of the voltage applied to the outer curved electrode 161 is positive, the ions are repelled from the outer curved electrode 161 and toward the inner curved electrode 162. Conversely, when the AC component is negative, the ions are attracted toward the outer curved electrode 161.

A plate 170 having a resolving aperture 171 are disposed at the output end 164 of the deflector 160. The resolving aperture may be circular or rectangular and may be between 1 and 10 cm. In order for ions to pass through the resolving aperture 171, the phase of the AC component applied to the outer curved electrode 161 may be such that as the ions enter the input end of the deflector 160, these ions are not deflected toward either curved electrode. After travelling a short distance, the ions are then repelled from the outer curved electrode 161 so that the ions are deflected toward the right. This may cause the ions to bend through the curved portion of the deflector 160. After some time, the ions may then be attracted toward the outer curved electrode 161 so that they maintain a straight path through the resolving aperture 171. However, if the phase of the AC component is different than this, the ions may not reach the resolving aperture 171. For example, if the AC component is negative when the ions reach the curved portion of the deflector 160, the ions will be deflected toward the left, rather than toward the right. Thus, the phase $\varphi_3$ helps determine which ions are able to pass through the resolving aperture 171.

While the above example described an embodiment where a constant voltage is applied to the inner curved electrode 162, there are other embodiments. For example, the voltage applied to the inner curved electrode 162 may be defined as:

$$V_{inner} = V_{ac3} * \sin(ft + \varphi_4) + V_{dc3},$$

where the $V_{ac3}$ and $V_{dc3}$ may represent the AC and DC components, respectively, and may be equal to the values applied to the outer curved electrode 161. The phase $\varphi_4$ may differ from $\varphi_3$, so that the amount of deflection experienced by the ions varies as a function of time. In certain embodiments, $\varphi_4$ is 180° out of phase with $\varphi_3$.

Figure 3A:
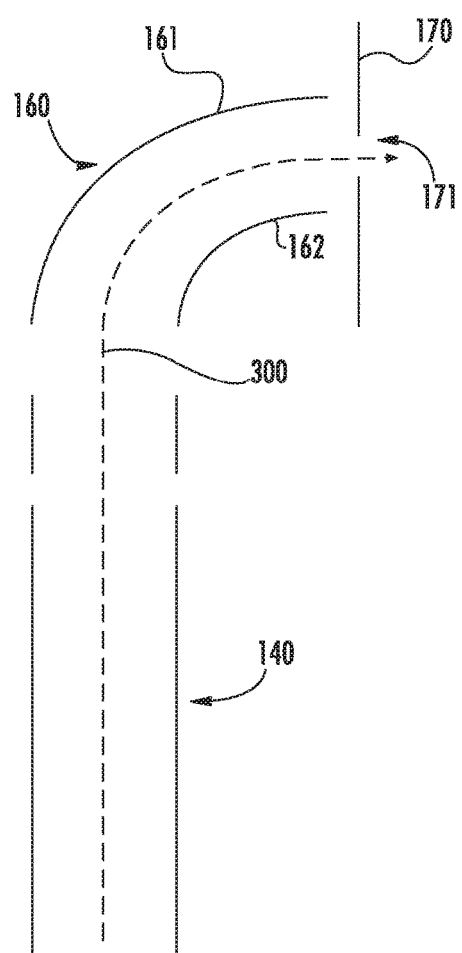
FIG. 3A shows the path of the desired species of ions.
Figure 3B:
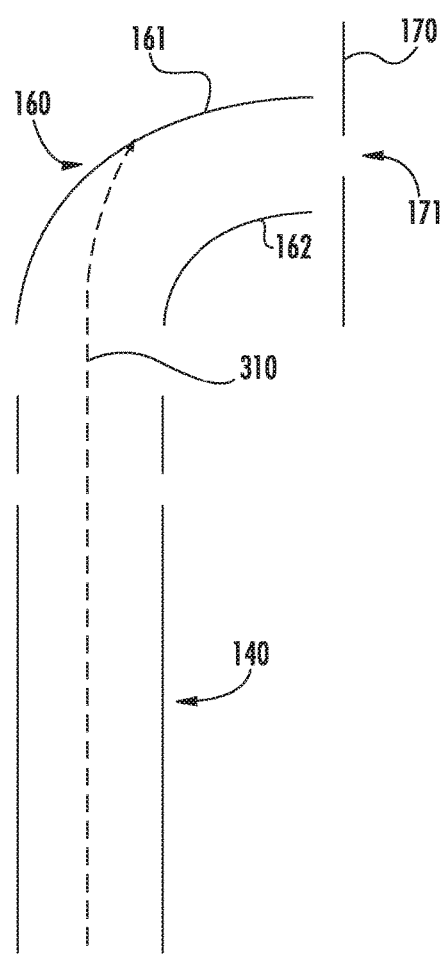
FIG. 3B shows the path of other species of ions.

FIGS. 3A and 3B show the operation of this electrodynamic mass analysis system. FIG. 3A shows the path 300 of the desired species of ions as they traverse the electrodynamic mass analysis system. As can be seen, because the voltages and phases of all of the electrodes are configured appropriately, the desired species of ions travels along a path 300 into the buncher tube 140. After exiting the output end of the buncher tube 140, the desired species of ions enters the deflector 160, where these ions are deflected in such a way so that these ions are able to pass through the resolving aperture 171.

FIG. 3B shows the path 310 of ions that are not desired. Because the mass of these ions differs from that of the desired ions, these undesired ions arrive at the input end of the deflector 160 at a different time than the desired ions. Consequently, the phase of the voltage applied to the curved electrodes is not appropriate to allow the undesired ions to pass through the resolving aperture 171. Thus, in some cases, the undesired ions may strike the outer curved electrode 161, as shown in FIG. 3B. However, in other embodiments, the undesired ions may strike the inner curved electrode 162. In other embodiments, the undesired ions may strike the plate 170 but not pass through the resolving aperture 171.

Thus, the voltages, including both the AC and DC components, applied to each electrode, along with the phase of each AC component, determines which ions have the appropriate mass to pass through the resolving aperture 171. In some embodiments, the magnitudes of the AC and DC components of these voltages may each be between 1000V and 10000V. Of course, other ranges of values may also be used. The frequency of the AC components may be the same for all electrodes, and may range from 100 kHz to over 10 MHz, depending on the desired duration of the pulse of ions.

Figure 2:
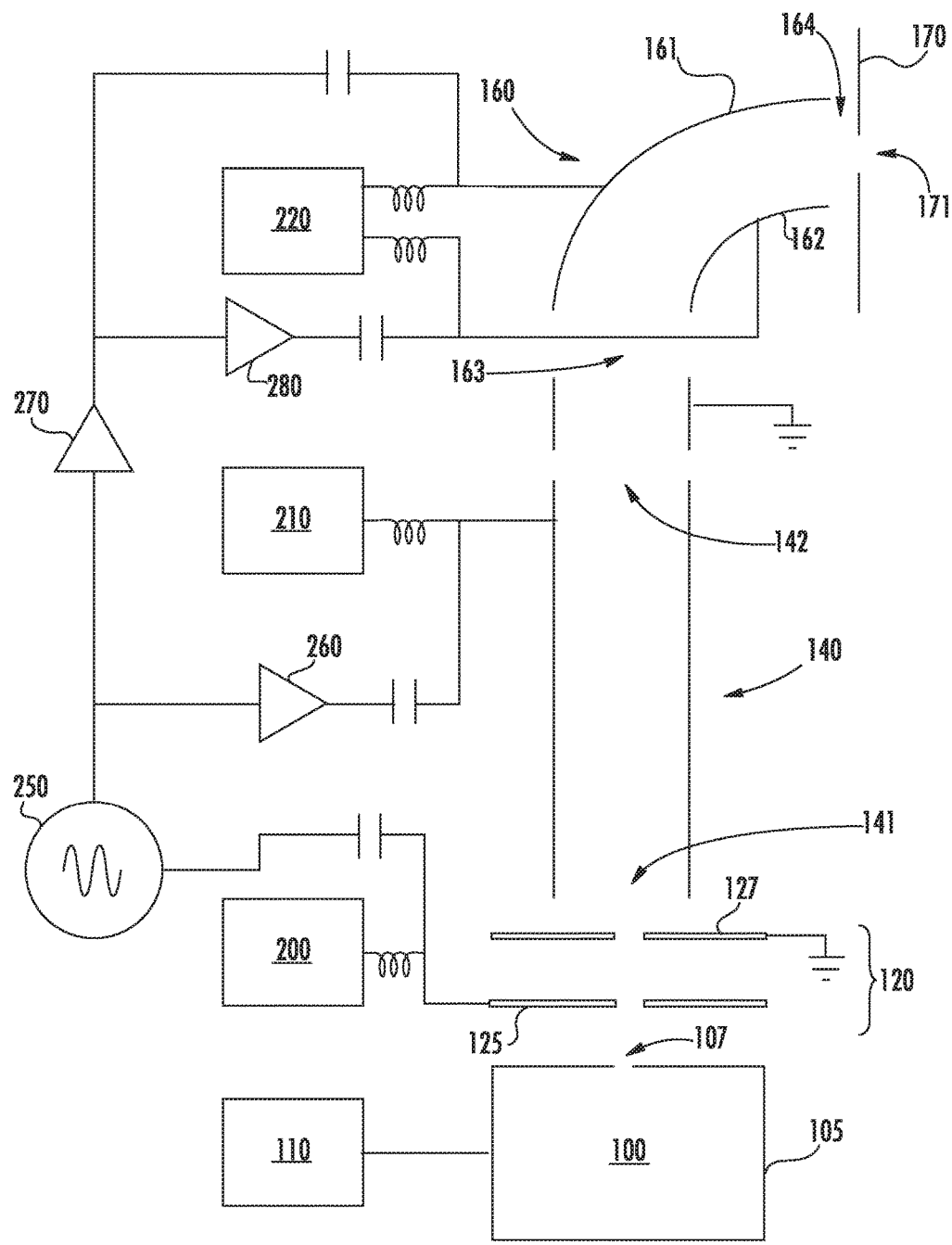
FIG. 2 shows an electrodynamic mass analysis system for separating ions based on their mass according to another embodiment.

In one particular embodiment, a common time-varying power supply may be used to supply the AC component to all of the electrodes. FIG. 2 shows one such embodiment. In this embodiment, identical components have been assigned the same reference designators as in FIG. 1. In this embodiment, an AC power supply 250 is used to provide the AC component (i.e. $V_{ac1} * \sin(ft)$) to each of the electrodes in the electrodynamic mass analysis system. For example, the suppression electrode 125 is powered by a first DC power supply 200, which provides a constant or DC voltage, $V_{dc1}$. The AC voltage from the AC power supply 250 is then coupled to the suppression electrode 125 through the use of a capacitor and an inductor. This results in a voltage of $V_{dc1} + V_{ac1} * \sin(ft)$ being applied to the suppression electrode 125.

A second DC power supply 210 is used to supply the DC component to the electrodes that make up the buncher tube 140. This DC component may be $V_{dc2}$. The AC component from the AC power supply 250 is modified by the use of gain/phase stage 260. The gain/phase stage 260 introduces a phase shift ($\varphi_2$) to the AC component from the AC power supply 250. Additionally, the gain/phase stage 260 may also change the magnitude of the AC component. The output from the gain/phase stage 260 may be coupled to the electrodes that make up the buncher tube 140 through the use of an inductor and a capacitor. This results in a voltage of $V_{dc2} + V_{ac2} * \sin(ft + \varphi_2)$ being applied to the suppression electrode 125.

A third DC power supply 220 is used to supply the DC component to the curved electrodes that make up the deflector 160. This DC component may be $V_{dc3}$. The AC component from the AC power supply 250 is modified by the use of gain/phase stage 270. The gain/phase stage 270 introduces a phase shift ($\varphi_3$) to the AC component from the AC power supply 250. Additionally, the gain/phase stage 270 may also change the magnitude of the AC component. The output from the gain/phase stage 270 may be coupled to the outer curved electrode 161 through the use of an inductor and a capacitor. This results in a voltage of $V_{dc3}+V_{ac3}*\sin(ft+\varphi_3)$ being applied to the outer curved electrode 161. An additional phase stage 280 may be employed to shift the phase of the AC component that is applied to the outer curved electrode 161. For example, the phase stage 280 may have unity gain and introduce a phase shift of 180° relative to the AC component that is applied to the outer curved electrode 161. This result in a voltage of $V_{dc3}+V_{ac3}*\sin(ft+\varphi_3+180°)$ being applied to the inner curved electrode 162.

While the figures show the components in two dimensions, it is understood that the present electrodynamic mass analysis system is equally adapted to manipulate ribbon ion beams. For example, the components shown in FIG. 1 may be extended in the depth direction (i.e. into the page). In this embodiment, the extraction aperture 107 may be rectangular in shape, such that ions extracted from the ion source 100 may be in the form of a ribbon beam, where the length of the ion beam extends into the page. The ribbon beam may have a length of 400 mm or more. Further, each component of the electrodynamic mass analysis system may also extend in the depth direction to accommodate the ribbon ion beam.

Thus, in certain embodiments, the electrodynamic mass analysis system comprises three major components that enable mass separation through the use of changing electrical fields.

The first component is the electrode assembly 120. The voltages applied to one or more electrodes in the electrode assembly 120 cooperate with the voltage applied to the chamber walls 105 of the ion source 100 in order to extract a pulse of ions, wherein the pulse has a predetermined duration. As described above, this may be achieved by applying a time varying voltage to the suppression electrode 125, while a constant voltage is applied to the chamber walls 105. Alternatively, a time varying voltage can be applied to the chamber walls 105 while a constant voltage is applied to the suppression electrode 125. In all embodiments, the electrode assembly 120 is configured to extract a pulse of ions from the ion source 100.

The second component is the buncher tube 140. The buncher tube performs two functions. First, the buncher tube 140 retards the leading ions and accelerates the lagging ions entering the input end 141 of the buncher tube 140 so that all of the ions exiting the electrode assembly 120 are in a tightly spaced cluster or bunch as they enter the buncher tube 140. This function is achieved by applying a time varying voltage to the electrodes that make up the buncher tube 140. Second, the length of the buncher tube 140 facilitates the separation of the ions based on their mass. As described above, the length of the buncher tube may a function of the energy of the ions extracted from the ion source 100 and the various masses of those ions.

The third component is a deflector 160. The deflector 160 uses time varying voltages applied to its outer and inner electrodes to deflect ions as they traverse the deflector 160. The deflector deflects the ions in accordance with an arrival time at the input end of the deflector, such that only ions arriving during a predetermined interval are guided through the deflector and exit the deflector through the resolving aperture 171. The time varying voltages are configured such that ions that enter the deflector during the selected time interval are guided through the deflector 160 and are able to exit through the resolving aperture 171. Ions that enter the deflector 160 at a different time are not guided toward the resolving aperture 171.

Thus, as explained above, these three components are capable of performing mass analysis through the use of changing electrical fields, without the use of magnets or magnetic fields.

In one test, it was found that the mass resolution of this system was at least 2. Mass resolution is defined as the mass of the desired ions divided by the resolving power. The resolving power is defined as the range of masses which are passed through the resolving aperture 171. Thus, for boron ions, which have a mass of 11, the resolving power is less than or equal to 5.5. Thus, ions having a mass which is within 2.75 amu of boron will also pass through the resolving aperture. However, in most cases, when boron is used as the desired ions, the other ions that are created include fluorine, which has a mass of 19, BF, which has a mass of 30 and $BF_2$, which has a mass of 49. These other species each has a mass which is outside the resolving power of the system. Thus, none of these other ions species will pass through the resolving aperture.

While the above disclosure describes three components, including a buncher tube, other embodiments are also possible. For example, in one embodiment, the ions that exit the electrode assembly 120 travel predetermined distance before entering the deflector 160. In certain embodiments, the ions may travel through a tube toward the deflector 160. However, unlike the buncher tube 140, this tube is not used to manipulate the ions that are extracted from the ion source 100. Rather, this tube may simply serve as a pathway along which the ions travel. As such, a constant voltage may be applied to this tube. For example, referring to FIG. 1, the voltage applied by tube power supply 150 to the buncher tube 140 may be a constant voltage. By eliminating the time varying component of the voltage, the tube no longer serves to bunch the ions. Rather, it simply serves as a conduit.

Figure 4:
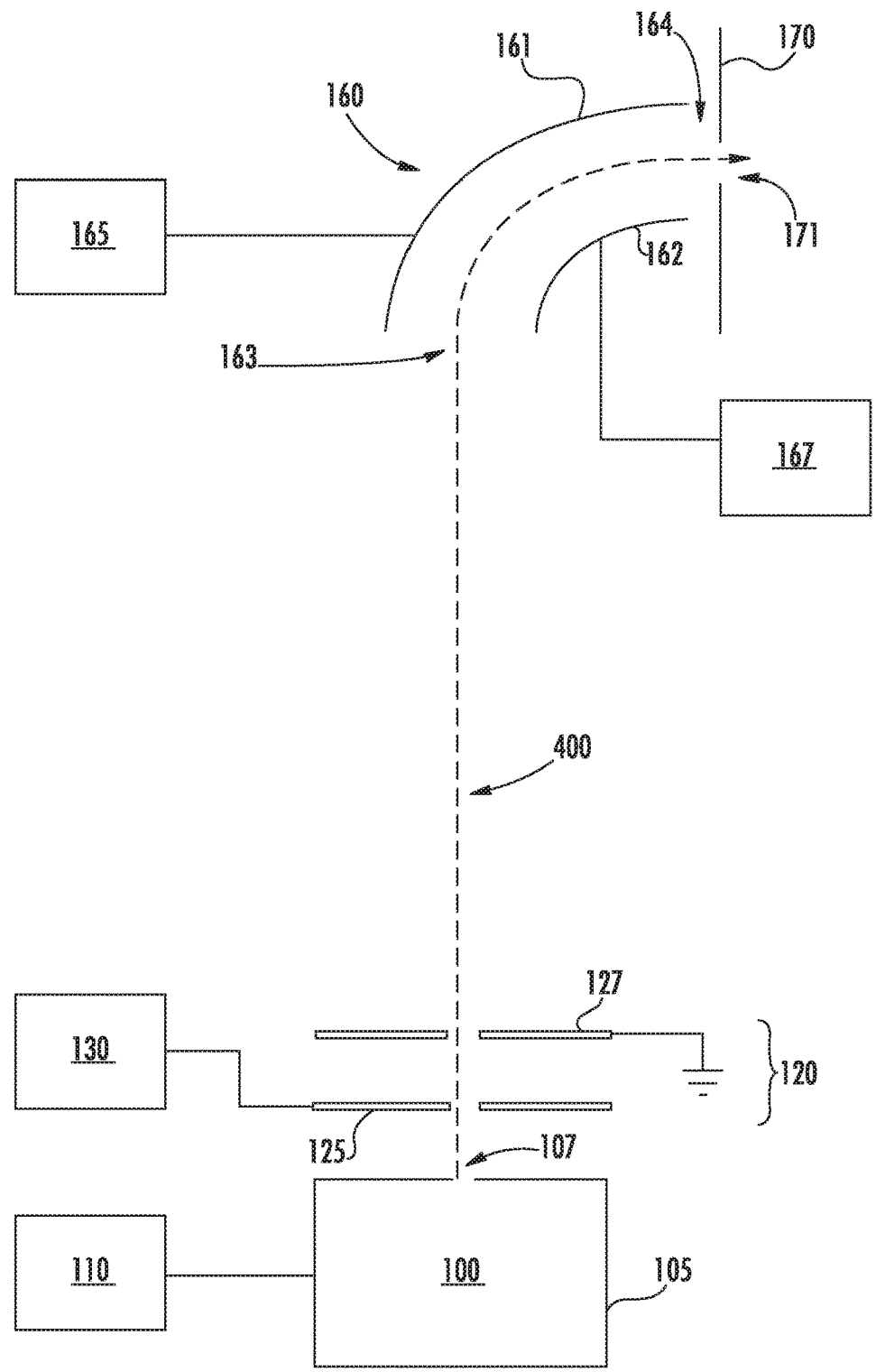
FIG. 4 shows an electrodynamic mass analysis system for separating ions based on their mass according to another embodiment.

In yet another embodiment, there is simply a space having a determined distance between the electrode assembly 120 and the deflector 160. This predetermined distance may be sufficiently long to allow the lower mass ions to arrive at the deflector 160 sufficiently earlier than the heavier ions. For example, this predetermined distance may be 0.5 meters or more. This embodiment is shown in FIG. 4. Note that FIG. 4 is similar to FIG. 1, but lacks the buncher tube 140 and the tube power supply 150. For clarity, the path 400 of the ions is shown in this figure.

Thus, in all embodiments, there is an ion source 100 and an electrode assembly 120 that cooperate to extract a pulse of ions from the ion source 100. Further, there is a deflector 160 which deflects the ions in accordance with an arrival time, such that only those ions arriving during a predetermined time interval are guided through the deflector 160 and exit the deflector 160. Finally, there is a space having a predetermined distance between the electrode assembly 120 and the input end of the deflector 160. In certain embodiments, such as is shown in FIGS. 1 and 2, a buncher tube 140 may be disposed in this space. As described above, a constant voltage or a time varying voltage may be applied to this buncher tube. In other embodiments, such as that shown in FIG. 4, a space of a predetermined distance exists between the electrode assembly 120 and the deflector 160. In all embodiments, this predetermined distance allows the ions to separate both spatially and temporally, as a function of their mass. In this way, the arrival time of ions at the input of the deflector is related to their mass, and the deflector can be used to guide only desired ions through the resolving aperture.

Furthermore, while this disclosure describes the time varying component has being a sinusoidal voltage, other embodiments are also possible. For example, the AC component may have a sawtooth shape, a pulsed shape or another time varying shape.

The present electrodynamic mass analysis system has many advantages. First, by utilizing time varying electrical fields, it is possible to separate an ion beam by mass without the use of expensive magnets. Until now, all ion implanters with mass analyzed beams have used magnets. This electrodynamic approach has the potential to be cheaper, lighter and utilize a smaller footprint. It also may have fundamental advantages for the particle performance of the tools because high frequency AC fields may not transport particles. It may also have advantages in terms of gate oxide survivability since the beam used to treat the wafers is pulsed, and the time between pulses may be an opportunity for electrons to neutralize any positive charge deposited during the pulse. Pulsed beam systems also have a higher effective instantaneous dose rate, which might have advantages for some processes. Also, pulsed beam systems benefit from gaps between the positive ion pulses as mentioned above.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An electrodynamic mass analysis system, comprising:
   an ion source;
   an electrode assembly to extract a pulse of ions from the ion source; and
   a deflector to receive the pulse of ions after the ions travel a predetermined distance from the electrode assembly, the deflector comprising two curved electrodes disposed on opposite sides of a path of the ions;
   a plate having a resolving aperture disposed at an output end of the deflector;
   wherein the deflector deflects the ions in accordance with an arrival time, such that only ions arriving during a predetermined time interval are guided through the deflector, and exit the deflector through the resolving aperture.

2. The electrodynamic mass analysis system of claim 1, comprising:
   a buncher tube disposed in a space between the electrode assembly and the deflector, having an input end and an output end, wherein the pulse of ions enters the input end of the buncher tube from the electrode assembly, wherein the buncher tube manipulates the ions to cause the pulse of ions entering the input end to be grouped in a cluster, the buncher tube having a length sufficient to allow separation of the ions in accordance with relative mass, and
   wherein the deflector receives the ions exiting the output end of the buncher tube.

3. The electrodynamic mass analysis system of claim 2, wherein a first time varying voltage is applied to the buncher tube and a second time varying voltage is applied to the deflector.

4. The electrodynamic mass analysis system of claim 3, where a frequency of the first time varying voltage is equal to a frequency of the second time varying voltage.

5. The electrodynamic mass analysis system of claim 1, wherein chamber walls of the ion source are biased at a constant voltage and a time varying voltage is applied to the electrode assembly to extract the pulse of ions.

6. The electrodynamic mass analysis system of claim 1, wherein chamber walls of the ion source are biased at a time varying voltage and a constant voltage is applied to the electrode assembly to extract the pulse of ions.

7. The electrodynamic mass analysis system of claim 1, wherein only electric fields are used to manipulate the ions.

8. An electrodynamic mass analysis system, comprising:
   an ion source having a plurality of chamber walls defining an ion source chamber, wherein one of the chamber walls comprises an extraction aperture;
   a suppression electrode to extract a pulse of ions from the ion source chamber though the extraction aperture;
   a deflector to receive the ions extracted from the ion source, the deflector comprising two curved electrodes disposed on opposite sides of a path of the ions, wherein a time varying voltage is applied to at least one of the two curved electrodes, and wherein a voltage applied to the two curved electrodes is different; and
   a buncher tube disposed between the suppression electrode and the deflector, having an input end and an output end, wherein the pulse of ions from the ion source enters the input end of the buncher tube, wherein the buncher tube comprises one or more conductive electrodes, and the ions exit the output end and enter the deflector.

9. The electrodynamic mass analysis system of claim 8, wherein a first time varying voltage is applied to a first curved electrode and a second time varying voltage is applied to a second curved electrode, and wherein a frequency of the first time varying voltage is equal to a frequency of the second time varying voltage, and a phase of the first time varying voltage is different than a phase of the second time varying voltage.

10. The electrodynamic mass analysis system of claim 8, wherein only electric fields are used to manipulate the ions.

11. The electrodynamic mass analysis system of claim 8, wherein a first time varying voltage is applied to a first curved electrode and a second time varying voltage is applied to the buncher tube, and wherein a frequency of the second time varying voltage is equal to a frequency of the first time varying voltage.

12. The electrodynamic mass analysis system of claim 8, wherein a first time varying voltage is applied to the suppression electrode, a second time varying voltage is applied to the buncher tube, and a third time varying voltage is applied to the deflector, wherein a frequency of the first time varying voltage, a frequency of the second time varying voltage and a frequency of the third time varying voltage are equal.

13. The electrodynamic mass analysis system of claim 8, wherein a time varying voltage is applied to a first curved electrode and a constant voltage is applied to a second curved electrode.

14. An electrodynamic mass analysis system, comprising:
an ion source having a plurality of chamber walls defining an ion source chamber, wherein one of the chamber walls comprises an extraction aperture;
a suppression electrode to extract a pulse of ions from the ion source chamber though the extraction aperture;
a buncher tube, having an input end and an output end, wherein the pulse of ions enters the input end of the buncher tube, wherein the buncher tube comprises one or more conductive electrodes;
a deflector to receive the ions exiting the output end of the buncher tube, the deflector comprising two curved electrodes disposed on opposite sides of a path of the ions;
a first power supply, in communication with the suppression electrode, the first power supply generating a first voltage having a first DC component and a first AC component, the first AC component comprising a frequency and a first phase;
a second power supply, in communication with the buncher tube, the second power supply generating a second voltage having a second DC component and a second AC component, the second AC component comprising the frequency and a second phase; and
a third power supply, in communication with a first of the two curved electrodes, the third power supply generating a third voltage having a third DC component and a third AC component, the third AC component comprising the frequency and a third phase.

15. The electrodynamic mass analysis system of claim 14, wherein a fourth voltage is applied to a second of the two curved electrodes, the fourth voltage having the third DC component and a fourth AC component, the fourth AC component comprising the frequency and a fourth phase.

16. The electrodynamic mass analysis system of claim 15, wherein the fourth phase is 180° different from the third phase.

17. The electrodynamic mass analysis system of claim 14, wherein the buncher tube comprises a plurality of electrodes, wherein the second voltage is applied to the plurality of electrodes.

18. The electrodynamic mass analysis system of claim 14, further comprising a resolving aperture disposed at an output end of the deflector.

19. An electrodynamic mass analysis system of claim 14, wherein the electrodynamic mass analysis system has a mass resolution of at least 2.

* * * * *